United States Patent
Turnquist et al.

Patent Number: 5,883,906
Date of Patent: Mar. 16, 1999

[54] PATTERN DATA COMPRESSION AND DECOMPRESSION FOR SEMICONDUCTOR TEST SYSTEM

[75] Inventors: James Alan Turnquist; Leon Lee Chen, both of Santa Clara, Calif.

[73] Assignee: Advantest Corp., Tokyo, Japan

[21] Appl. No.: 911,929

[22] Filed: Aug. 15, 1997

[51] Int. Cl.$^6$ .................................................. G01R 31/28
[52] U.S. Cl. ..................... 371/27.1; 395/183.08
[58] Field of Search .......................... 371/27.1, 22.33, 371/22.6, 28, 37.6; 395/878, 880, 416, 421.07, 421.08, 421.11, 183.08; 364/488, 490, 550, 718

[56] References Cited

U.S. PATENT DOCUMENTS

| | | | |
|---|---|---|---|
| 5,151,903 | 9/1992 | Mydill et al. | 371/27 |
| 5,301,199 | 4/1994 | Ikenaga et al. | 371/22.5 |
| 5,499,248 | 3/1996 | Behrens et al. | 371/22.1 |
| 5,719,881 | 2/1998 | Yonetoku | 371/27 |
| 5,737,512 | 4/1998 | Proudfoot et al. | 395/183.08 |

Primary Examiner—Robert W. Beausoliel, Jr.
Assistant Examiner—Nadeem Iqbal
Attorney, Agent, or Firm—Muramatsu & Associates

[57] ABSTRACT

A compression and decompression apparatus to be used for transferring test pattern data from a storage device of a host computer to a pattern memory in a semiconductor test system for testing a semiconductor device to decrease the time required for the data transfer. The compression and decompression apparatus includes: a compression means for classifying vector data in the test pattern data into a first group to be compressed to a short code and a second group not to be compressed, and for producing a look-up table showing relationship between the short code and the vector data in the first group; a compressed test pattern file storing compressed test pattern including the short code, data vector in the second group and the look-up table; and a hardware decompression circuit provided in the semiconductor test system or proximity thereto for decompressing the compressed test pattern based on the short code and the relationship shown in the look-up table and for sending decompressed test pattern to the pattern memory in the semiconductor test system.

15 Claims, 7 Drawing Sheets

Fig.5D

| 1 Byte | | | | | | | | | | | | | |
|---|---|---|---|---|---|---|---|---|---|---|---|---|---|
| 0 | 1 | 0 | 0 | 4 | 1 | 5 | 3 | 2 | 0 | 1 | 3 | 0 | 2 |
| 0 | 1 | 2 | 3 | 4 | 5 | 6 | 7 | 8 | 9 | 10 | 11 | 12 | 13 |

Fig.5C

| B | D | A | F | E | G | — — | M | Q | — — — | X |
|---|---|---|---|---|---|---|---|---|---|---|
| 0 | 1 | 2 | 3 | 4 | 5 | — — | 126 127 | 128 | — — — | 2047 |

Fig.5B

| B | D | A | F | E | G |
|---|---|---|---|---|---|
| 5 | 3 | 2 | 2 | 1 | 1 |

Fig.5A

| 8 Byte | | | | | | | | | | | | | |
|---|---|---|---|---|---|---|---|---|---|---|---|---|---|
| B | D | B | B | E | D | G | F | A | B | D | F | B | A |
| 0 | 1 | 2 | 3 | 4 | 5 | 6 | 7 | 8 | 9 | 10 | 11 | 12 | 13 |

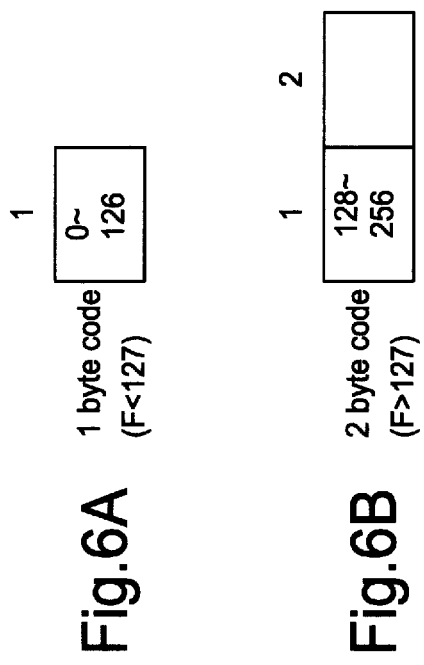
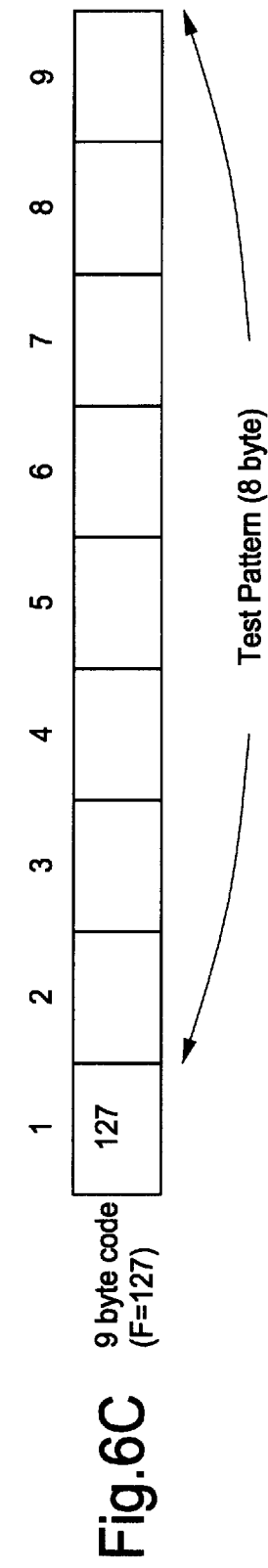

PATTERN DATA COMPRESSION AND DECOMPRESSION FOR SEMICONDUCTOR TEST SYSTEM

FIELD OF THE INVENTION

This invention relates to a pattern data compression and decompression process and a hardware decompression circuit to be used in a semiconductor test system for testing semiconductor devices, and more particularly, to a pattern data compression and decompression process and a circuit arrangement which transfer test patterns from a hard disk of a host computer to a pattern memory of the semiconductor test system in a short period of time prior to the start of the test.

BACKGROUND OF THE INVENTION

In testing semiconductor devices such as IC memories and IC processors by a semiconductor test system, test patterns are supplied to the semiconductor device under test and resultant outputs of the semiconductor device are compared with expected value patterns to determine whether the semiconductor device functions correctly or not. The test patterns and expected value patterns including associated control data are frequently called test vectors in the semiconductor test industry because the major portion of the patterns are repetitive based on, for example, a mathematical algorithm.

Generally, such test patterns and expected value patterns (collectively "test patterns") are generated by a test pattern generator provided in the semiconductor test system under the control of a test controller provided in the test system. Test patterns are unique to the types of semiconductor device or the kinds of device test. The test patterns are usually stored in a hard disk of a host computer, such as a Unix host, or external storage devices. The test pattern generator has a pattern memory with a large memory capacity to store the test patterns. Thus, prior to the test, the test pattern is transferred from the hard disk of the host computer to the pattern memory in the pattern generator through the test controller.

FIG. 1 shows a basic structure of a semiconductor test system. A host computer 11 is a user accessible computer whose operating system is, for example, Unix. A hardware semiconductor test system 10 includes a pattern generator 15, a wave formatter 17 and a comparator 19. The hardware test system (tester) 10 is directly controlled by a tester controller (TC) 13. The tester controller 13 is a computer exclusive to the semiconductor tests system 10 and not directly controlled by the user. A semiconductor device 12 under test (DUT) receives a test pattern through the wave formatter 17 and the resultant output signals are compared with an expected value pattern by the comparator 19.

The pattern generator 15 includes a pattern memory 18 to store test patterns (test patterns and expected value patters) transferred from the host computer 11 through the test controller 13 and a tester bus 14. The test patterns are usually stored in a hard disk 16 of the host computer 11 as pattern files and transferred to the pattern memory prior to the start of the testing.

Such a transfer of test patterns occur frequently when devices to be tested are changed or different test programs are executed. The size of the pattern files may be several megabytes or several tens of megabytes, or more, because of the complexities of modern semiconductor devices to be tested. Therefore, it takes significant time to transfer the test patterns from the host computer 11 to the pattern memory 18 in the pattern generator 15.

Because the semiconductor test system is an expensive large scale computer system, it is necessary for a user to use the test system, in a most cost effective way. Further, in the semiconductor industry, there is always a strong demand in increasing the test efficiency to reduce the overall production cost of the semiconductor devices. Therefore, for operating the semiconductor test system with utmost efficiency, it has become important to reduce the time required for transfer the test patterns from the host to the pattern memory.

SUMMARY OF THE INVENTION

Therefore, it is an object of the present invention to provide a test pattern compression and decompression technology for a semiconductor test system to improve the transfer rate of the test pattern from a hard disk of a host computer to a pattern memory in a semiconductor test system.

It is another object of the present invention to provide compression and decompression to decrease the time required for the test pattern transfer from the host computer file to the pattern memory in the pattern generator of the semiconductor test system.

It is a further object of the present invention to provide a combination of compression software and decompression hardware to decrease the time required for the test pattern transfer from the host computer file to the pattern memory in the pattern generator in the semiconductor test system.

One aspect of the present invention is a compression and decompression apparatus to be used for transferring test pattern data from a storage device of a host computer to a pattern memory in a semiconductor test system for testing a semiconductor device.

The compression and decompression apparatus is comprised of:

a compression means for classifying vector data in the test pattern data into a first group to be compressed to a short code and a second group not to be compressed, and for producing a look-up table showing relationship between the short code and the vector data in the first group;

a compressed test pattern file storing compressed test pattern including the short code, data vector in the second group and the look-up table; and a hardware decompression circuit provided in the semiconductor test system or proximity thereto for decompressing the compressed test pattern based on the short code and the relationship shown in the look-up table and for sending decompressed test pattern to the pattern memory in the semiconductor test system.

Another aspect of the present invention is a compression and decompression method to be used for transferring test pattern data from a storage device of a host computer to a pattern memory in a semiconductor test system for testing a semiconductor device.

The compression and decompression method is comprised of the following steps of:

extracting vector data from a test pattern file in the storage device;

classifying the vector data into three groups, a first group of which has a higher frequency of data repetition, a second group has an intermediate frequency of data repetition and a third group has a lower frequency of data repetition than that of the first or second group;

converting the vector data in the first and second groups to a short code and a long code, respectively, indicating an order of the data repetition rate, and specifying the vector data in the third group by an escape code and attaching the vector data in the third group to the escape code;

forming a translation table showing the relationship between the short code and the vector data in the first group and between the long code and the vector data in the second group;

merging the short code, long code and escape code attached by the vector data in the third group with non-vector data from the storage device to form a compressed test pattern file;

receiving the compressed test pattern by a decompression means and detecting the short code, long code and escape code in the compressed test pattern;

translating the short code and long code to corresponding vector data in the first and second groups based on the relationship shown in the translation table by the decompression means; and sending the vector data in the first and second groups translated by the decompression means and the vector data in the third group to the pattern memory in the semiconductor test system.

According to the present invention, the transfer rate of the test pattern from the hard disk of the host computer to the pattern memory in the semiconductor test system is significantly improved by compressing the pattern data, transferring the compressed pattern data to the semiconductor test system, and decompressing the compressed pattern data in the semiconductor test system. The test pattern compression and decompression of the present invention includes a unique coding system having a short, long and escape code as well as the translation table to achieve the optimum efficiency and simplicity.

The compression and decompression process can be carried out solely by software in one aspect of the present invention. In another aspect of the present invention, the compression process is performed by the software while the decompression process is performed by the hardware decompression circuit. The combination of the compression software and the decompression hardware provides the most favorable effects in decreasing the time required for the test pattern transfer from the host computer file to the pattern memory in the pattern generator of the semiconductor test system.

BRIEF DESCRIPTION OF THE DRAWINGS

FIGS. 5A–5D are detailed diagrams for explaining the test pattern compression and decompression procedure of the present invention by way of specific example. FIG. 5A shows a set of test pattern before compression and FIG. 5B shows frequencies of data repetition in the example of FIG. 5A. FIG. 5C shows an example of a translation table produced on the basis of FIGS. 5A and 5B. FIG. 5D shows compressed data corresponding to the test pattern of FIG. 5A.

FIGS. 6A–6C are schematic diagrams showing data structures of compressed data of the present invention based on the examples of FIGS. 5A and 5B. FIG. 6A shows a structure of one byte code and FIG. 6B shows a structure of two byte code. FIG. 6c shows a structure of nine byte code which is a combination of an index code and eight byte pattern data.

DETAILED DESCRIPTION OF THE PREFERRED EMBODIMENT

Figure 2:
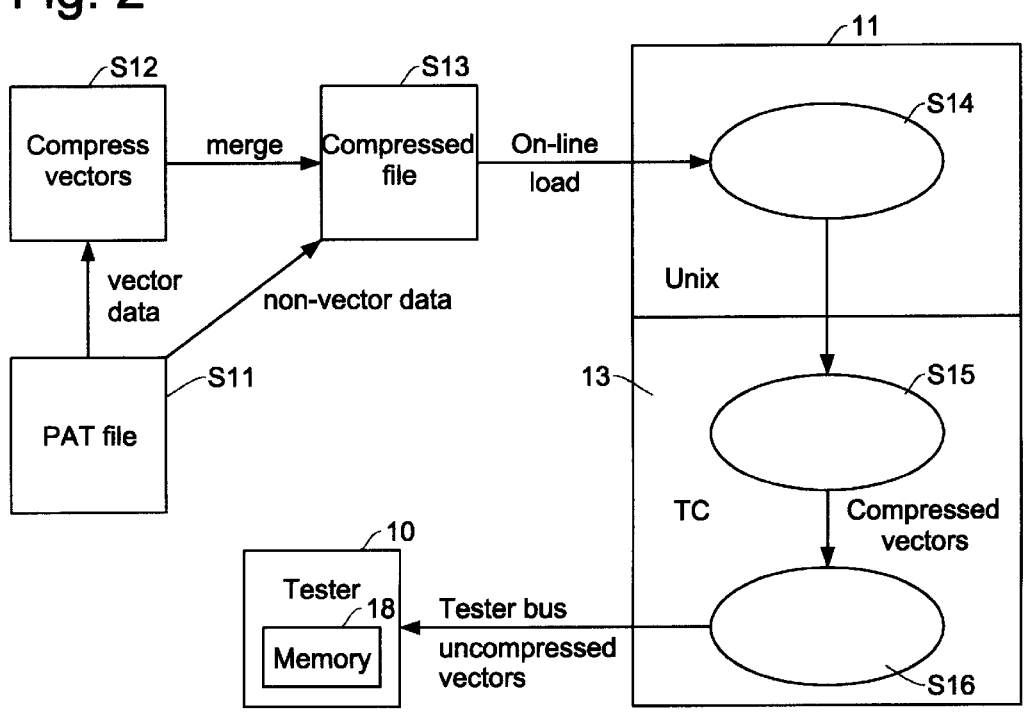
FIG. 2 is a data flow diagram showing a basic concept of a test pattern compression and decompression scheme to be used for a semiconductor test system according to the present invention.

FIG. 2 is a schematic diagram showing a basic concept of a test pattern compression and decompression scheme of the present invention. Basically, the original test pattern is compressed and stored in a compressed pattern file. When testing a semiconductor device, the compressed pattern data is transferred to the semiconductor tester where it is decompressed to increase the overall transfer rate of the test pattern. In FIG. 2, this procedure is expressed by a data flow diagram.

In the step S11, the test pattern in the pattern file is classified into the vector data (repetitive data) and the non-vector data (non-repetitive data). The vector data in the pattern file undergoes a compression process in step S12 to form compressed vectors. The compressed vectors are merged with the non-vector data in the pattern file in the step S13 to form a compressed pattern file separately from the original file in the step S11. Thus, the compressed pattern file is a combination of non-vector data and compressed vector data. As will be explained later, the compressed pattern file also includes a translation table (look-up table) to be used in a decompression process.

Prior to the start of the test, a host computer of, for example, a Unix operating system provides, a read request through the hard disk driver in the step S14 so that the compressed pattern file is transferred to a tester controller (TC) through a read buffer in the step S15. The compressed pattern file is decompressed in the step S16 through a decompression process which will be described later. Thus, the decompressed test pattern is transferred through the tester bus to the pattern memory 18 in the pattern generator. An overall time (transfer rates) required for sending the pattern data from the host computer to the pattern memory is improved by the compression and decompression process of FIG. 2.

Figure 3A:
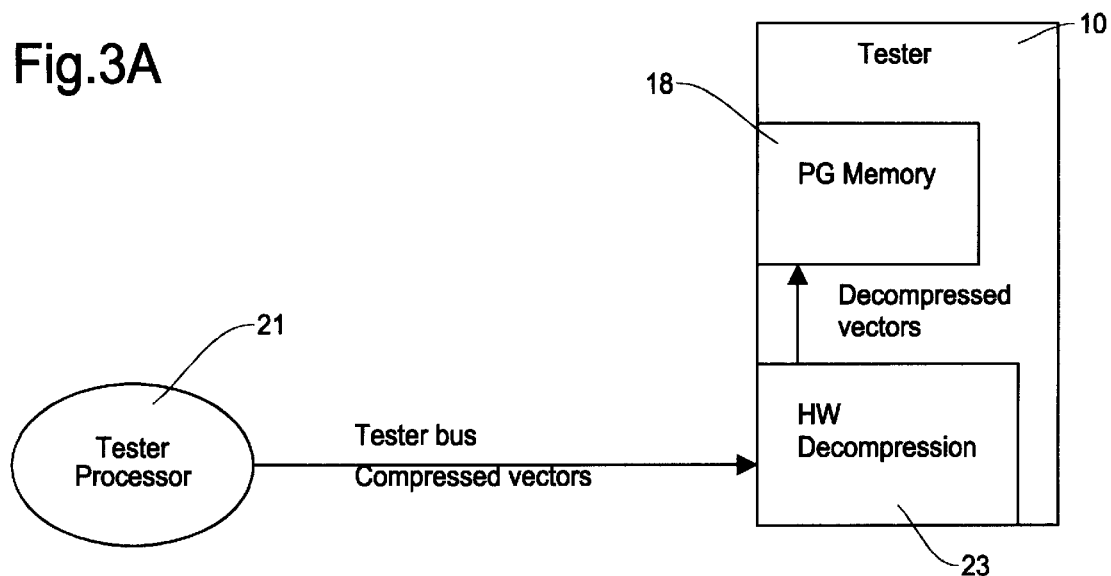
FIGS. 3A and 3B are block diagrams each of which showing a basic structure of a test pattern decompression by hardware of the present invention.
Figure 3B:
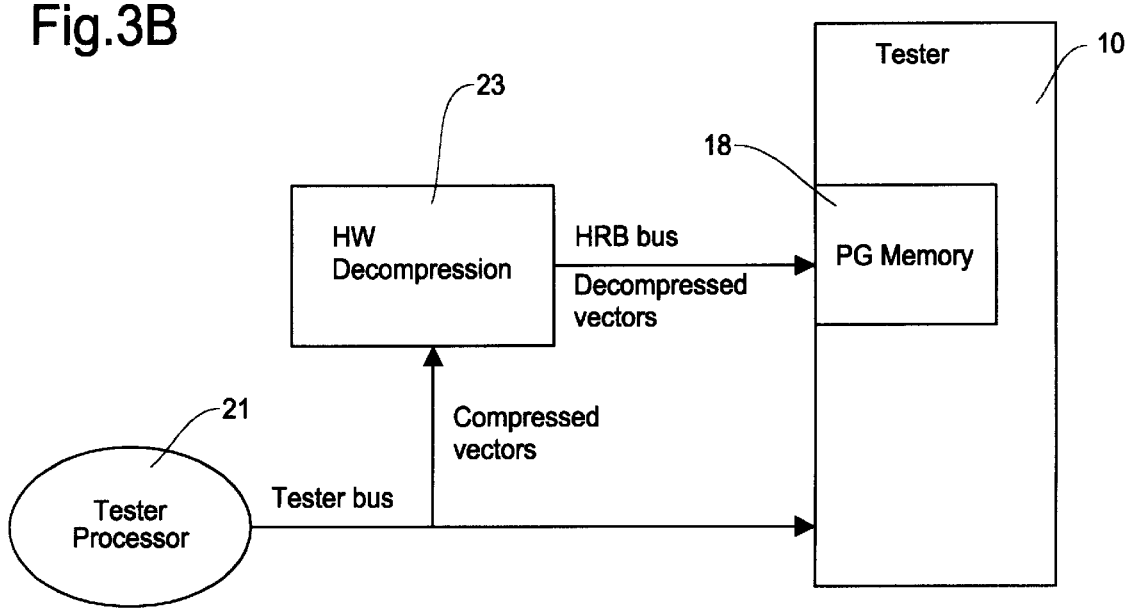

Significantly higher transfer rates can be achieved by implementing a hardware decompression circuit. FIGS. 3A and 3B are block diagrams each of which showing a basic structure of a test pattern decompression by hardware. As shown in the example of software compression and decompression scheme of the present invention in FIG. 2, the decompressed test patterns are transferred from the test controller TC to the pattern memory 18 through the tester bus. In the hardware decompression, the compressed test patterns are transferred through the tester bus and the decompression process is carried out in the tester hardware 10 or outside of the tester hardware 10 before being stored in the pattern memory 18.

FIG. 3A shows an example of basic structure for hardware decompression. In this example, a hardware decompression circuit 23 is provided in the tester hardware 10 close to the pattern memory 18. The compressed pattern file produced, for example, in the step S13 of FIG. 2, is transferred through the tester bus from the host computer 11 and the test controller TC. The compressed file is received by the hardware decompression circuit 23 where it is decompressed and is stored in the pattern memory 18.

FIG. 3B shows another example of basic structure for hardware decompression. In this example, a hardware decompression circuit 23 is provided outside of the tester hardware 10 close to the pattern memory 18. The compressed pattern file produced as noted above is transferred through the tester bus from the host computer 11 and the test controller TC. The compressed file is received by the hardware decompression circuit 23. The decompressed pattern file is then transferred to the pattern memory 18 in the tester hardware 10 through a bus line provided, for example, on a printed circuit board.

Figure 4:
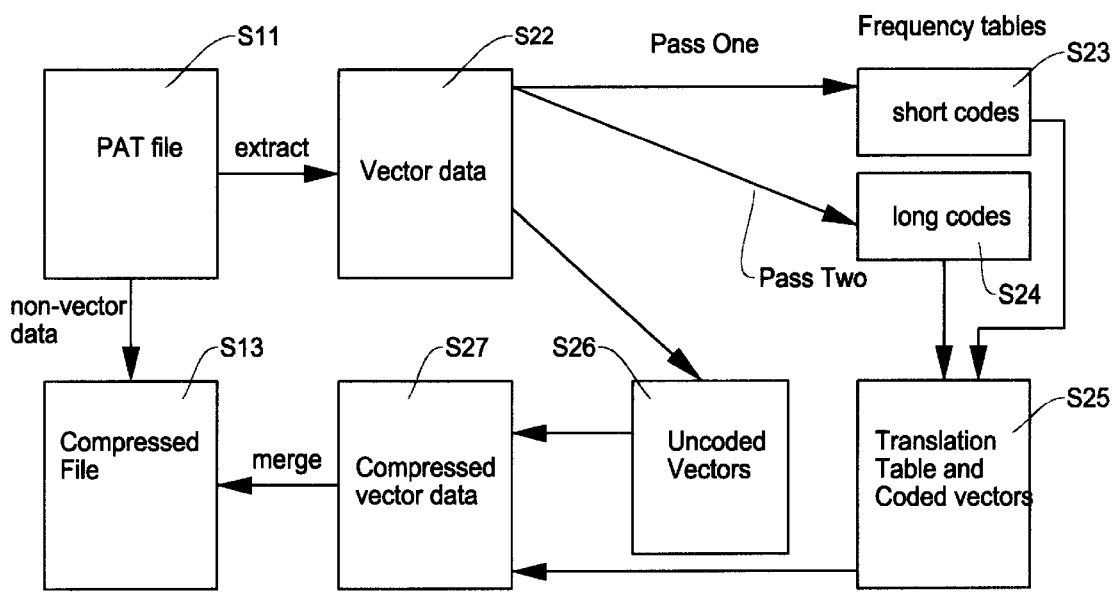
FIG. 4 is a block diagram showing a test pattern compression process of the present invention.

FIG. 4 is a block diagram showing a test pattern compression process of the present invention. As described with reference to FIG. 1, the vector data is first extracted, and eventually merged with the non-vector data after the compression process in order to preserve the non-vector information. The merged data (compressed pattern) is stored in a compressed pattern file as in the step S13 of FIG. 2.

In the present invention, the pattern data compression occurs in the two passes illustrated in FIG. 4. For example, the pattern may consist of a large number of test patterns each of which has a length of 8 bytes. The test patterns are grouped into the vector data which is repetitive data and the non-vector data which is not repetitive data. The vector data, each of which consists of 8 byte pattern, is further classified into a small number of groups based on the number of frequency of data repetition rate.

The first group of the pattern data in the pattern file having higher frequencies of repetition will be represented by one byte codes with an associated translation table. The second group of the pattern data having lower frequencies in the pattern file will be represented by two byte codes with the associated translation table. The third group of pattern data, which is still vector pattern data but has lower repetition rate than the second group, will not be compressed.

Therefore, the pattern data in the first and second groups are compressed and later decompressed after being transferred to the tester. In contrast, the pattern data in the third group is not compressed and be transferred by the unit of 9 byte (one index byte and 8 byte pattern data) to the pattern memory in the tester hardware. In either the one byte code, two byte code or nine byte code, the first one byte is used as an index code to determine which group the code in question belongs, as will be explained in more detail later.

The first, second and third group of pattern data and the translation table are merged and stored in the hard disk of the host computer as the compressed file. As noted above, distinction between the first, second and third group is made by the first byte of the data in the compressed file. Such a distinction process is carried out in the decompression process described later.

In the foregoing, the pattern data is treated as having eight byte words. However, the natural sequence size of the vector data may be four bytes. This shorter sequence length generally yields a higher level of repetition, however, the improved compression requires significantly more complex compression and decompression algorithm. Empirical results from pattern file data shows that encoding 8 byte pattern yields a good trade-off between repetition rate, compression ratio, and decompression speed.

With reference to the specific example of FIG. 4, the pattern file in the step S11 is extracted the vector data therein in the step S22. The vector data is analyzed regarding the frequency of data repetition rate and the frequency table is formed in the order of the repetition rate. Based on the frequency table, the vector data is classified into three groups, the first group which has higher repetition rates (most repeated vector data) in the step S23, the second group having lower repetition rates than the first group in the step S24, and the third group having the lowest repetition rates in the step S26.

In the step S25, each of the pattern data in the first group is converted to a short code, such as one byte (8 bit) in the order of the repetition rate. Also, each of the pattern data in the second group is converted to a long code, such as two byte (16 bit), in the order of the repetition rate. The translation table (look-up table showing the conversion rules) is also established in the step S25 to be used in the decompression process.

Since the third group of vector data has the lowest repetition rates, it is considered that the compression and decompression process will not give rise any meaningful improvement in the transfer rate. Therefore, unlike the first and second groups, the third group vector data is not replaced with short codes but is only provided with a predetermined index code in the step S26. For example, the pattern data in this group is formed of 9 byte with the first one byte for the index and the remaining 8 byte for the pattern data itself in the original form.

The coded vectors and the translation table created in the step S25 and the uncoded vector determined in the step S26 are combined as compressed vector data in the step S27. The compressed vector data in the step S27 and the non-vector data in the pattern file S11 are merged to create the compressed pattern file in the step S13. The compressed pattern file is stored in the hard disk of the host computer and is transferred prior to the test to the tester where it is decompressed.

FIGS. 5A–5D are detailed diagrams for explaining the test pattern compression procedure of the present invention by way of a specific example. FIG. 5A is a schematic diagram showing test patterns in the pattern file. FIG. 5B is a schematic diagram showing the order of data repetition frequencies in the test patterns of FIG. 5A. FIG. 5C is a schematic diagram showing an example of translation table, i.e., a look-up table for decompression, of the present invention for the test patterns of FIG. 5A. FIG. 5D is a schematic diagram showing compressed test patterns based on the translation table of FIG. 5C for the original test patterns of FIG. 5A.

In this example of FIG. 5A, each of the test patterns has an eight (8) byte length. The test patterns of FIG. 5A are stored in the hard disk of the host computer. Preferably, prior to the transfer to the tester hardware, the test patterns are converted to the compressed test patterns and stored in a compressed pattern file along with the translation table in the hard disk.

All of the test pattern data of FIG. 5A is read and analyzed the frequency of data repetition. The result of the repetition rate is shown in the frequency table of FIG. 5B. In this example, the pattern B has the highest frequency followed by the patterns D, A and F. Based on the frequency table, the pattern data is classified into three groups. This process is performed in the steps S22–S24 of FIG. 4 as discussed above.

The first group has the highest repetition rate. In this example, the first group includes 127 most repeated pattern data. Thus, the test patterns in the first group are converted to one byte codes showing the index number of 0–126 in the order of the repetition rate as shown in the translation table of FIG. 5C. The second group of the test patterns has a lower repetition rate than the first group of test patterns. The second group of test patterns may include 1920 test patterns. The test patterns in the second group are converted to two byte codes showing the index number of 128–2047 in the order of the repetition rate as shown in the lower part of FIG. 5C.

The third group of the test patterns has the lowest repetition rate. The third group is considered that the compression and decompression process will not give rise to any meaningful improvement in the transfer rate of the test patterns. Therefore, unlike the first and second groups, the third group vector data is not replaced with short codes but provided with the index code. For example, the pattern data in this group is formed of 9 byte with the first one byte for the index showing the number "127" followed by the remaining 8 byte which is the pattern data in the original form.

As showing in the translation table of FIG. 5C, the test pattern B is converted to "0", and the test pattern D is converted to "1". Likewise, the test patterns A, F, E and G are converted to "2", "3", "4" and "5", respectively. Based on this translation, the test pattern of FIG. 5A is converted to the compressed test pattern of FIG. 5D. In FIG. 5D, each of the compressed test pattern is expressed by one byte since the test patterns in FIG. 5A are within the first 127 most repeated patterns.

In case where a frequency of repetition of a test pattern in FIG. 5A is lower than 127, i.e., ranked between 128 and 2047, the corresponding compressed test patterns of FIG. 5D will be expressed by two bytes. In the translation table of FIG. 5C, when the first one byte shows a numeral "127", then the corresponding 8 byte test pattern will not be compressed and simply attached to the first byte as shown in FIG. 6C.

The compressed test pattern of FIG. 5D and the translation table of FIG. 5C are stored in the compressed pattern file. The compressed pattern file is transferred to the semiconductor tester prior to the semiconductor device test for performing a decompression process.

FIGS. 6A–6C show the structure of the one byte, two byte and nine byte codes of the test pattern of the present invention to be transmitted to the semiconductor tester. As noted above, the first byte is used as an index code. In FIG. 6A, the one byte code (index code) represents the first group of test patterns having the highest repetition rate. In this example, the one byte code expresses numerals 0–126 in the order of the repetition rate. Thus, when the code expresses a numeral "0", it represents the test pattern B which is the highest repetition data in the example of FIG. 5. Thus, when the one byte code expresses a numeral "4", it represents the test pattern E in the example of FIG. 5.

FIG. 6B shows the two byte code of the present invention. The two byte code is used to express the second group of test patterns having lower repetition rate than that of the first group. In the two byte code. the first byte (index code) shows the number greater than "127". In the example of FIGS. 5 and 6, the test patterns whose repetition rate are ranked between 128–2047 are compressed to the two byte codes of FIG. 6B. For example, when the two byte code expresses a numeral "128", it represents the test pattern Q in the example of FIG. 5. When the two byte code expresses a numeral "2047", it represents the test pattern X in the example of FIG. 5.

FIG. 6C shows the nine byte code of the present invention. The nine byte code is a escape code which will not experience the compression or decompression process of the present invention. Since the data repetition rate is so low in certain test patterns, the eight byte words are not compressed but rather attached to the index code. For example, the index code to identify this group of pattern data is a numeral "127". Thus, the nine byte codes of FIG. 6C are stored in the compressed file together with the one byte codes and the two byte codes.

The compressed test patterns shown in FIG. 5D (i.e., the codes of FIG. 6) and the translation table of FIG. 5C are transferred to the tester thereby a decompression process is carried out. The decompression process may be performed either by a software program or a hardware decompression circuit. The software decompression process is carried out by the tester controller TC connected to the tester hardware. As shown in FIG. 3, the hardware decompression process is performed by the decompression circuit provided within the tester hardware 11 close to the pattern memory in the pattern generator or the outside of the tester hardware 11.

Figure 7:
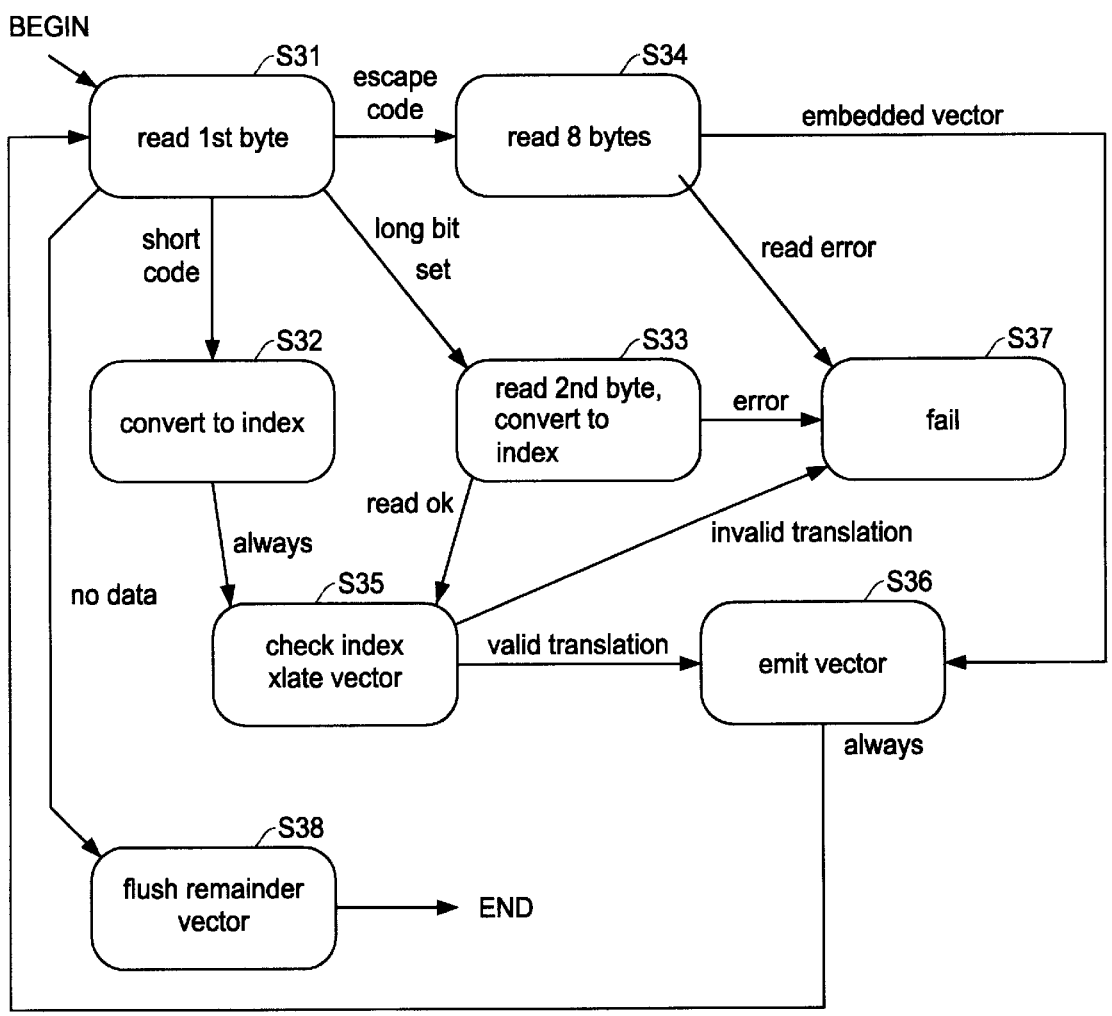
FIG. 7 is a state diagram showing the test pattern decompression process by software of the present invention.

FIG. 7 is a state diagram showing the test pattern decompression process by the software decompression of the present invention. The decompression algorithm in the present invention can be described as a coding sequence of one, two or nine bytes into a 64 bit data word. These coded sequences are put in a stream and give a decoded output stream of 64 bit (8 byte) data words. As noted above, prior to the decompression process, the compressed test patterns, i.e., the one byte, two byte and nine byte codes and the translation table (look-up table) of FIGS. 5 and 6 are transferred to the tester.

The decompression process starts in the step S31 to read the first byte (index code) of the compressed test pattern whether the code in question is a short (one byte) code, long (two byte) code or escape (nine byte) code. If the first byte indicates that the code in question is a one byte code, in the step S32, the one byte code is converted to an index number. In the example of FIGS. 5 and 6, this index number is smaller than "127". The 64 bit word (test pattern) designated by this index number is retrieved in the translation table in the step S35. The translated test pattern is emitted in the step 36 and is transmitted to the pattern memory in the tester hardware.

If the first byte indicates that the code in question is a two byte code, in the step S33, the second byte is read, and the two byte code is converted to an index number. In the example of FIGS. 5 and 6, this index number is greater than 127 and smaller than 2048. The 64 bit word designated by the index number is retrieved in the translation table in the step S35. The translated test pattern is emitted in the step 36 and is transmitted to the pattern memory in the tester hardware.

If the first byte indicates that the code is a nine byte code, in the step S34, the eight (8) byte word attached to the first byte is read and is directly emitted as the test pattern in the step S36. Every time the test pattern is emitted in the step S36, the process goes back to the step S31 to repeat the foregoing steps. In case where there is any error in reading the codes or translating the index numbers, the process fails in the step S37. When the last compressed data is executed in the decompression process, the process ends in the step S38.

Figure 8:
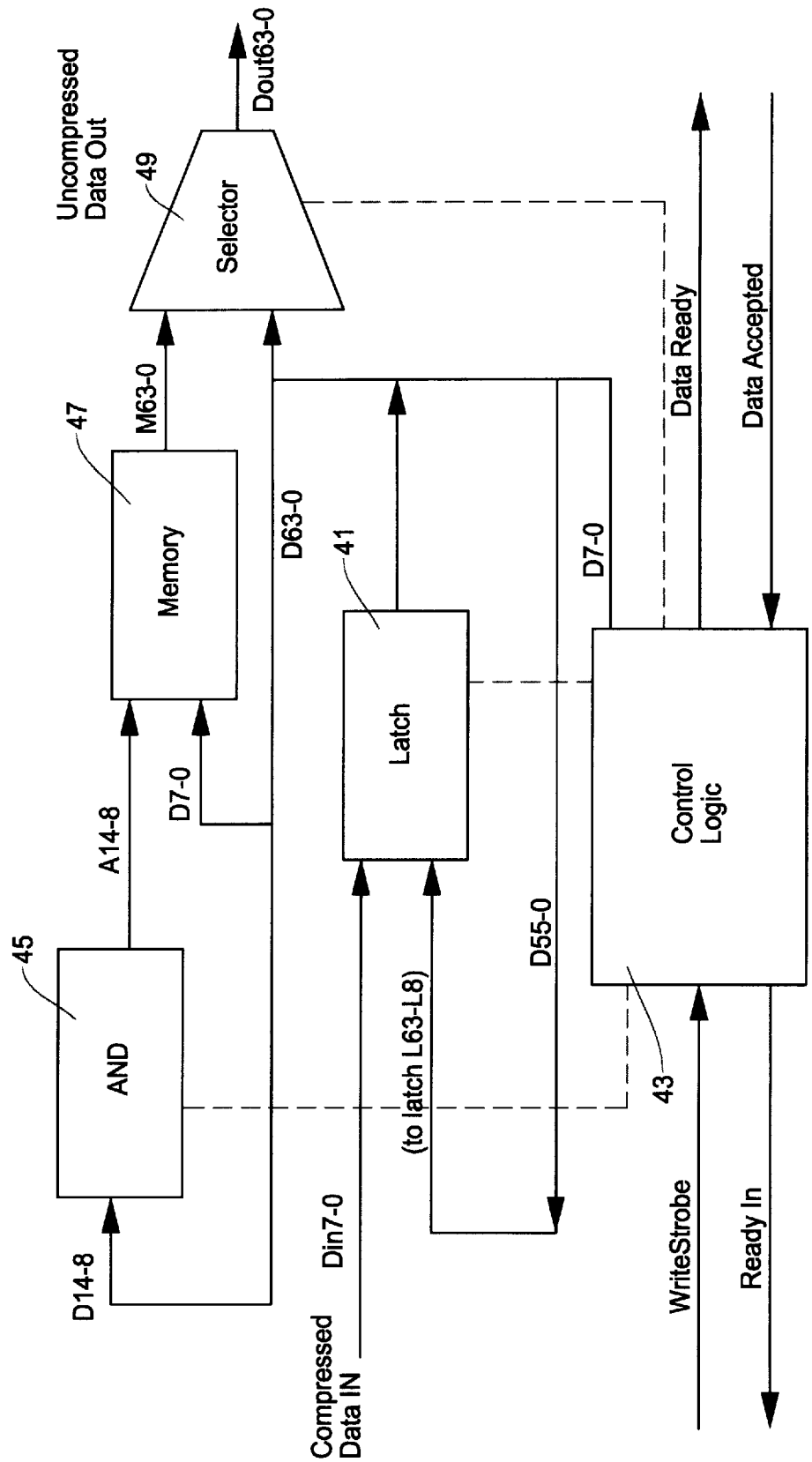
FIG. 8 is a block diagram showing a test pattern decompression circuit of the present invention.

FIG. 8 is a block diagram showing the test pattern decompression circuit of the present invention. The decompression circuit includes a latch 41, a control logic 43, an AND circuit 45, a memory 47 and a selector 49. The control logic 43 controls the overall operation of the decompression process in the decompression circuit. At the start of the decompression operation, the memory 47 is loaded therein the translation (look-up) table as shown in FIG. 5C received from the compressed pattern file.

The compressed pattern data from the compressed pattern file is streamed into the input "Din7-0" of the decompression circuit of FIG. 8. The communication between the compressed file and the decompression circuit and between the decompression circuit and the pattern memory will be made, for example, in a hand shake manner through lines "WriteStrobe", "ReadyIn", "DataReady" and "DataAccepted" shown in FIG. 8. Although not shown, the decompression circuit includes an input device and an output device to receive and send the pattern data.

When "ReadyIn" and "WriteStrobe" are true, the control logic 43 clocks the latch 41 so that a byte of the compressed pattern data is latched into the latch 41 through the input device. The control logic 43 checks if the byte "D7-0" latched by the latch 41 is a one, two or nine byte code. At the same time, the control logic 43 will set "ReadyIn" false.

If the compressed data received by the decompression circuit is a one byte code, the byte "7-0" is translated to 64 bit pattern data "M63-0" by the look-up table in the memory 47. The control logic 43 will set the selector 49 to select the data "M63-0" as output data "Dout63-0" and set the AND circuit 45 to make the output (second byte) "A14-8" to zero. If "DataAccepted" is true, the "DataReady" line will be strobed to clock the data "Dout63-0" to the output device. Then "ReadyIn" will be set true.

If the input data is a two byte code, the control logic 43 will set the "ReadyIn" true and clock the latch 41 to accept the next byte placed in the input "Din7-0". The second byte accepted by the latch 41 is expressed as the code "D14-8" in FIG. 8. The control logic 43 will set the AND circuit 45 to pass the code "D14-8" to "A14-8". The first byte "7-0" and the second byte "A14-8" access the memory 47 to produce the decompressed eight byte pattern data "M63-0" through the look-up table. The control logic 43 will set the selector 49 to select the data "M63-0" as the output data "Dout63-0". If "DataAccepted" is true, the "DataReady" line will be strobed to clock the data "Dout63-0" to the output device. Then "ReadyIn" will be set true.

If the input data is a nine byte code, the control logic 43 will set the "ReadyIn" true and clock the latch 41 to accept the next eight byte placed in the input "Din7-0" by repeating the hand strobes "WriteStrobell and ReadyIn" eight times. The eight bytes thus latched by the latch circuit 41 is as the pattern data "D63-0" in FIG. 8. The control logic 43 will set the selector 49 to select the pattern data "D63-0" as the output data "Dout63-0". If "DataAccepted" is true, the "DataReady" line will be strobed to clock the data "Dout63-0" to the output device. Then "ReadyIn" will be set true.

Figure 1:
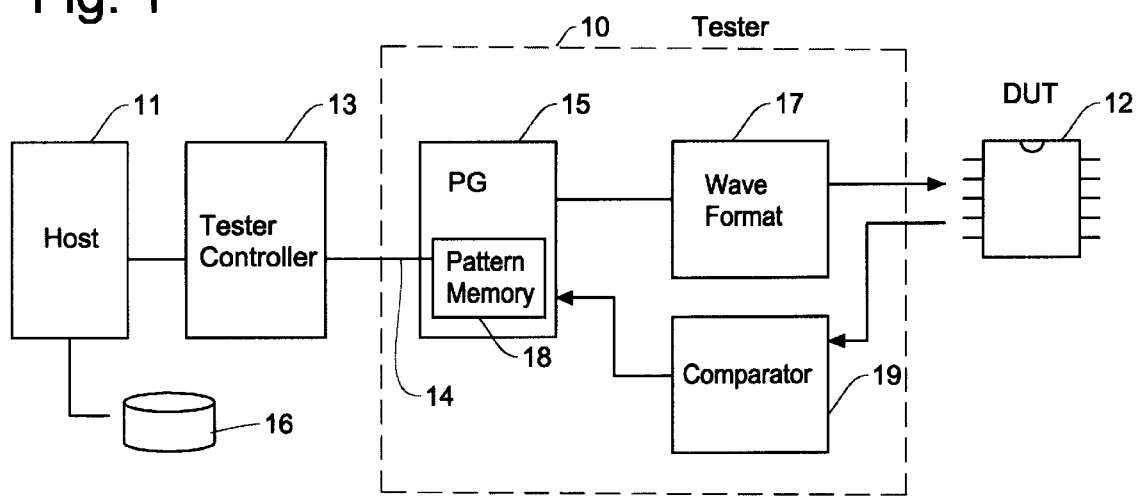
FIG. 1 is a schematic block diagram showing a basic structure of a semiconductor test system for testing a semiconductor device.

In the foregoing, the decompression process is performed by the hardware decompression circuit. Using the hardware decompression, the data passing through the tester bus 14 of FIG. 1 is still the compressed pattern data, and the highest transfer rate can be achieved.

According to the present invention, the transfer rate of the test pattern from the hard disk of the host computer to the pattern memory in the semiconductor test system is significantly improved by compressing the pattern data, transferring the compressed pattern data to the semiconductor test system, and decompressing the compressed pattern data in the semiconductor test system. The test pattern compression and decompression of the present invention includes a unique coding system having a short, long and escape code as well as the translation table to achieve the optimum efficiency and simplicity.

The compression and decompression process can be carried out solely by software in one aspect of the present invention. In another aspect of the present invention, the compression process is performed by the software while the decompression process is performed by the hardware decompression circuit. The combination of the compression software and the decompression hardware provides the most favorable effects in decreasing the time required for the test pattern transfer from the host computer file to the pattern memory in the pattern generator of the semiconductor test system.

We claim:

1. A compression and decompression method to be used for transferring test pattern data from a storage device of a host computer to a pattern memory in a semiconductor test system for testing a semiconductor device, comprising the following steps of:

extracting vector data from a test pattern file in said storage device;

classifying said vector data into three groups, a first group of which has a higher frequency of data repetition, a second group has an intermediate frequency of data repetition and a third group has a lower frequency of data repetition than that of said first or second group;

converting said vector data in said first and second groups to a short code and a long code, respectively, indicating an order of said data repetition rate, and specifying said vector data in said third group by an escape code and attaching said vector data in said third group to said escape code;

forming a translation table showing the relationship between said short code and said vector data in said first group and between said long code and said vector data in said second group;

merging said short code, said long code and said escape code attached by said vector data in said third group with non-vector data from said storage device to form a compressed test pattern file;

receiving said compressed test pattern by a decompression means and detecting said short code, said long code and said escape code in said compressed test pattern;

translating said short code and long code to corresponding vector data in said first and second groups based on said relationship shown in said translation table by said decompression means; and sending said vector data in said first and second groups translated by said decompression means and said vector data in said third group to said pattern memory in said semiconductor test system.

2. A compression and decompression method as defined in claim 1, wherein each of said vector data in said pattern file is configured by eight bytes (64 bits) and said short code is configured one byte and said long code is configured by two bytes.

3. A compression and decompression method as defined in claim 1, wherein each of said vector data in said pattern file is configured by eight bytes (64 bits) and said short code and is configured one byte and said long code is configured by two bytes and said escape code is configured by one byte which is attached by the eight byte vector data in said third group.

4. A compression and decompression method as defined in claim 1, wherein each of said vector data in said pattern file is configured by eight bytes (64 bits) and said short code represents 127 most frequently repeated vector data in said first group while said long code represents the next 1920 most repeated vector data in said second group.

5. A compression and decompression apparatus to be used for transferring test pattern data from a storage device of a host computer to a pattern memory in a semiconductor test system for testing a semiconductor device, comprising:

a compression means for classifying vector data in said test pattern data into a first group to be compressed to a short code and a second group not to be compressed, and for producing a look-up table showing relationship between said short code and said vector data in said first group;

a compressed test pattern file storing compressed test pattern including said short code, data vector in said second group and said look-up table; and a hardware decompression circuit provided in said semi-conductor test system or proximity thereto for decompressing said compressed test pattern based on said short code and said relationship shown in said look-up table and for sending decompressed test pattern to said pattern memory in said semiconductor test system.

6. A compression and decompression apparatus as defined in claim 5, wherein said compression means classify said vector data based on frequencies of data repetition in said test pattern data, and said compressed pattern file is merged by said compressed test pattern and non-vector data in said test pattern data.

7. A compression and decompression apparatus as defined in claim 5, said hardware decompression circuit comprising:

a control logic for controlling an overall decompression operation;

a latch for receiving said compressed test pattern under the control of said control logic;

a memory for storing said look-up table transferred from said compressed test pattern file to read the test pattern data based on said short code; and a selector for selecting either output data of said memory or output data of said latch under the control of said control logic.

8. A compression and decompression apparatus as defined in claim 7, said hardware decompression circuit further comprising an AND circuit which is controlled by said control logic for providing a second byte in said short code to said memory.

9. A compression and decompression apparatus as defined in claim 5, wherein each of said vector data in said test pattern data is configured by eight bytes (64 bits) and said short code is configured either one byte or two bytes.

10. A compression and decompression apparatus as defined in claim 5, wherein each of said vector data in said test pattern data is configured by eight bytes (64 bits) and said short code is configured either one byte or two bytes, and said vector data in said second group is provided with an escape code configured by one byte.

11. A compression and decompression apparatus to be used for transferring test pattern data from a storage device of a host computer to a pattern memory in a semiconductor test system for testing a semiconductor device, comprising:

means for extracting vector data from a test pattern file in said storage device;

means for classifying said vector data into three groups, a first group of which has a higher frequency of data repetition, a second group has an intermediate frequency of data repetition and a third group has a lower frequency of data repetition than that of said first or second group;

means for converting said vector data in said first and second groups to a short code and a long code, respectively, indicating an order of said data repetition rate, and specifying said vector data in said third group by an escape code and attaching said vector data in said third group to said escape code;

means for forming a translation table showing the relationship between said short code and said vector data in said first group and between said long code and said vector data in said second group;

means for merging said short code, said long code and said escape code attached by said vector data in said third group with non-vector data from said storage device to form a compressed test pattern file;

a control logic provided in said semiconductor test system or proximate thereto for controlling an overall decompression operation;

a latch for receiving said compressed test pattern under the control of said control logic;

a memory for storing said translation table transferred from said compressed test pattern file to read the test pattern data based on said short and long codes; and a selector for selecting either output data of said memory or output data of said latch under the control of said control logic.

12. A compression and decompression apparatus as defined in claim 11, further comprising an AND circuit which is controlled by said control logic for providing a second byte in said long code to said memory.

13. A compression and decompression apparatus as defined in claim 11, wherein each of said vector data in said pattern file is configured by eight bytes (64 bits) and said short code is configured one byte and said long code is configured by two bytes.

14. A compression and decompression apparatus as defined in claim 11, wherein each of said vector data in said pattern file is configured by eight bytes (64 bits) and said short code and is configured one byte and said long code is configured by two bytes and said escape code is configured by one byte which is attached by the eight byte vector data in said third group.

15. A compression and decompression method as defined in claim 11, wherein each of said vector data in said pattern file is configured by eight bytes (64 bits) and said short code represents 127 most frequently repeated vector data while said long code represents the next 1920 most repeated vector data in said pattern file.

* * * * *